US012733456B2

(12) United States Patent
Nakamura

(10) Patent No.: US 12,733,456 B2
(45) Date of Patent: Sep. 8, 2026

(54) MANUFACTURING METHOD, INSPECTION METHOD, AND INSPECTION DEVICE

(71) Applicant: HAMAMATSU PHOTONICS K.K., Hamamatsu (JP)

(72) Inventor: Tomonori Nakamura, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 385 days.

(21) Appl. No.: 18/284,168

(22) PCT Filed: Feb. 2, 2022

(86) PCT No.: PCT/JP2022/004078
§ 371 (c)(1),
(2) Date: Sep. 26, 2023

(87) PCT Pub. No.: WO2022/209266
PCT Pub. Date: Oct. 6, 2022

(65) Prior Publication Data

US 2024/0178073 A1 May 30, 2024

(30) Foreign Application Priority Data

Apr. 1, 2021 (JP) ................................ 2021-062954

(51) Int. Cl.
*H10P 74/20* (2026.01)
*G01N 21/55* (2014.01)
(Continued)

(52) U.S. Cl.
CPC ........... *H10P 74/203* (2026.01); *G01N 21/55* (2013.01); *G01N 21/9501* (2013.01); *G01N 21/956* (2013.01); *H10H 20/01* (2025.01)

(58) Field of Classification Search
CPC ......... H01L 22/10; H01L 22/12; H01L 22/14; H01L 21/66; H10H 20/01;
(Continued)

(56) References Cited

U.S. PATENT DOCUMENTS

2003/0008425 A1* 1/2003 Uemura ............... H10H 20/833 438/22
2009/0152585 A1* 6/2009 Shinohara ............. H10H 20/01 257/E33.023

(Continued)

FOREIGN PATENT DOCUMENTS

JP 2006-073815 A 3/2006
JP 2007-088389 A 4/2007

(Continued)

OTHER PUBLICATIONS

International Preliminary Report on Patentability mailed Oct. 12, 2023 for PCT/JP2022/004078.

(Continued)

*Primary Examiner* — Brook Kebede
(74) *Attorney, Agent, or Firm* — Faegre Drinker Biddle & Reath LLP

(57) ABSTRACT

A manufacturing method of a semiconductor device includes: a first step of forming a laminated film by growing crystals on a sapphire substrate, forming an insulating film on a laminated film, and forming contact holes at an electrical connection point of an n-GaN layer and an electrical connection point of a p-GaN layer in the insulating film to produce a first member; a second step of forming a conductive layer on the first member to produce a second member in which the conductive layer electrically connects the electrical connection point of the n-GaN layer and the electrical connection point of the p-GaN layer; a third step of irradiating the second member with excitation light and measuring light emission generated in the second member; and a fourth step of forming a first pad electrode and a second pad electrode to produce a semiconductor device.

12 Claims, 7 Drawing Sheets

(51) Int. Cl.

*G01N 21/95* (2006.01)
*G01N 21/956* (2006.01)
*H10H 20/01* (2025.01)

(58) Field of Classification Search

CPC ........... H10H 20/01335; H10H 20/815; H10H 20/84; H10H 20/825; H10H 29/01; H10H 29/032; G01N 21/55; G01N 21/88; G01N 21/95; G01N 21/9501; G01N 21/956; G01R 31/26; G01R 31/2635; G01R 31/2656

See application file for complete search history.

(56) References Cited

U.S. PATENT DOCUMENTS

2011/0204376 A1* 8/2011 Su ...................... H01L 25/0756 438/46
2014/0210995 A1 7/2014 Abe
2015/0162872 A1 6/2015 Nakanishi et al.
2017/0040490 A1* 2/2017 Lee ......................... H10F 77/70
2020/0219988 A1 7/2020 Kimura

FOREIGN PATENT DOCUMENTS

JP 2012-243954 A 12/2012
JP 2014-163857 A 9/2014
JP 2018-026576 A 2/2018
JP 2020161778 A * 10/2020 ......... G01N 21/9501
TW 201714313 A 4/2017
WO WO-2012/142651 A1 10/2012

OTHER PUBLICATIONS

European Search Report issued on Sep. 26, 2025 in corresponding European patent application 22779495.5.

* cited by examiner 1
90
110
100
20
30
31
32
82
72
40
52
51
S
11
12

(a)
200
300
REFLECTED IMAGE
(b)
200
200x
PL IMAGE
(c)
200z
PL IMAGE

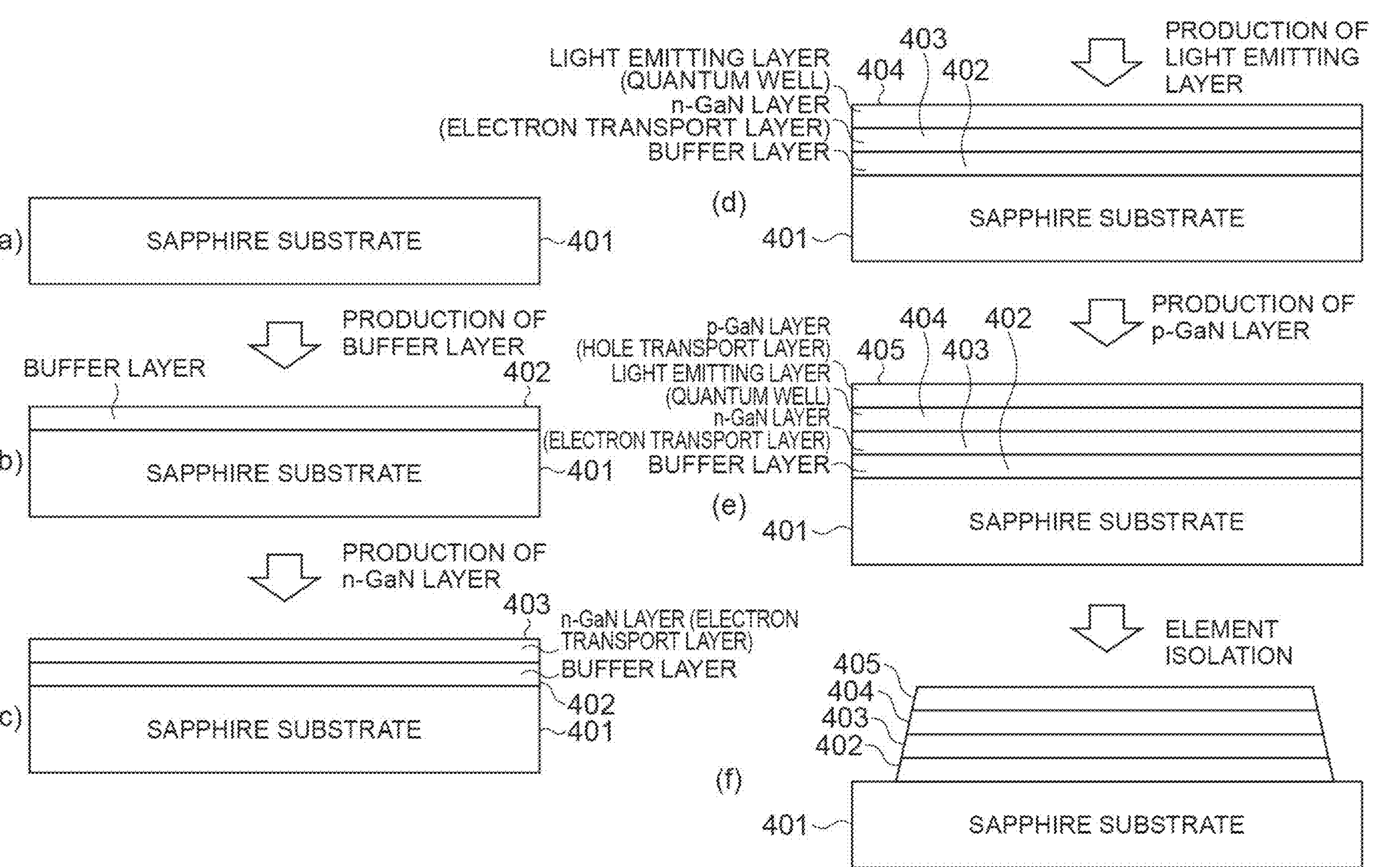
Fig.3
(a)
SAPPHIRE SUBSTRATE
401
PRODUCTION OF BUFFER LAYER
BUFFER LAYER
402
(b)
SAPPHIRE SUBSTRATE
401
PRODUCTION OF n-GaN LAYER
403
n-GaN LAYER (ELECTRON TRANSPORT LAYER)
BUFFER LAYER
402
(c)
SAPPHIRE SUBSTRATE
401
PRODUCTION OF LIGHT EMITTING LAYER
LIGHT EMITTING LAYER (QUANTUM WELL)
n-GaN LAYER (ELECTRON TRANSPORT LAYER)
BUFFER LAYER
404
403
402
(d)
SAPPHIRE SUBSTRATE
401
PRODUCTION OF p-GaN LAYER
p-GaN LAYER (HOLE TRANSPORT LAYER)
LIGHT EMITTING LAYER (QUANTUM WELL)
n-GaN LAYER (ELECTRON TRANSPORT LAYER)
BUFFER LAYER
405
404
403
402
(e)
SAPPHIRE SUBSTRATE
401
ELEMENT ISOLATION
405
404
403
402
(f)
SAPPHIRE SUBSTRATE
401

(a)
EXPOSURE OF n-GaN LAYER
405
404
403
402
401
SAPPHIRE SUBSTRATE
(b)
PRODUCTION OF INSULATING FILM
405
404
406
403
402
401
SAPPHIRE SUBSTRATE
(c)
FORMATION OF CONTACT HOLE
H2
405
404
H1
406
S1(S)
403
402
401
SAPPHIRE SUBSTRATE
(d)
FORMATION OF CONDUCTIVE LAYER
407
H2
405
404
H1
406
S2(S)
403
402
401
SAPPHIRE SUBSTRATE
(e)
FORMATION OF PAD
407B(407)
405
404
407A(407)
406
S3(S)
403
402
401
SAPPHIRE SUBSTRATE

MANUFACTURING APPARATUS
(PROCESS UNTIL FORMATION
OF CONDUCTIVE LAYER)
401
500
S2(S)
INSPECTION DEVICE
(PL MEASUREMENT)
1
OUTPUT
D1
S2
MANUFACTURING APPARATUS
(PROCESS AFTER
FORMATION OF PAD)
500
S3
D1
DATA SHOWING CONTACT
FAILURE POSITION
S

MANUFACTURING APPARATUS (PROCESS UNTIL FORMATION OF CONDUCTIVE LAYER)
401
500
S2(S)
INSPECTION DEVICE (PL MEASUREMENT)
1
OUTPUT
D1
S2
MANUFACTURING APPARATUS (PROCESS AFTER FORMATION OF PAD)
500
S3(S)
INSPECTION DEVICE (PL MEASUREMENT)
1
OUTPUT
D2
S3
D1
D2
LASER DEVICE
600
S4
DATA SHOWING CONTACT FAILURE POSITION
S
DATA SHOWING LEAK FAILURE POSITION
S

MANUFACTURING METHOD, INSPECTION METHOD, AND INSPECTION DEVICE

TECHNICAL FIELD

An aspect of the present invention relates to a semiconductor device manufacturing method, an inspection method, and an inspection device.

BACKGROUND ART

As a method of determining whether a light emitting element group formed on a wafer is defective or not, a method of observing photoluminescence emitted from a light emitting element and determining whether the light emitting element is defective or not based on the luminance of the photoluminescence is known (for example, see Patent Literature 1). According to such a method, it is possible to efficiently inspect a large number of fine light emitting elements compared to, for example, a method of determining whether the light emitting element is defective or not by probing (that is, based on electrical characteristics).

CITATION LIST

Patent Literature

Patent Literature 1: Japanese Unexamined Patent Publication No. 2014-163857

SUMMARY OF INVENTION

Technical Problem

Here, in the method of observing photoluminescence as described above, a leak failure can be detected, but a contact failure (open failure, high resistance failure, high threshold failure) cannot be detected appropriately. Therefore, in the method of observing photoluminescence as described above, a defective product (the light emitting element with a contact failure) may be included in the light emitting elements that are determined to be non-defective due to no leak failure. As a result, it may not be possible to appropriately determine whether the light emitting element is defective or not.

An aspect of the present invention has been made in view of the above-described circumstances and an object thereof is to appropriately detect a contact failure of a light emitting element.

Solution to Problem

A manufacturing method of a semiconductor device according to an aspect of the present invention is a manufacturing method of a semiconductor device provided with a plurality of light emitting elements, including: a first step of forming a laminated film including a buffer layer, an N layer, a light emitting layer, and a P layer by growing crystals on a substrate, forming an insulating film on the laminated film, and forming contact holes at an electrical connection point of the N layer and an electrical connection point of the P layer in the insulating film to produce a first member; a second step of forming a conductive layer on a surface provided with the insulating film in the first member to produce a second member in which the conductive layer electrically connects the electrical connection point of the N layer and the electrical connection point of the P layer; a third step of irradiating the second member with light and measuring light emission generated in the second member; and a fourth step of forming a first pad electrode corresponding to the electrical connection point of the N layer and a second pad electrode corresponding to the electrical connection point of the P layer by processing the conductive layer formed on the second member to produce the semiconductor device.

In the manufacturing method of the semiconductor device according to an aspect of the present invention, in the manufacturing step of the semiconductor device in which the laminated film and the insulating film are formed, the contact holes are formed at the electrical connection point of the N layer and the electrical connection point of the P layer of the insulating film, the conductive layer is formed on the insulating film, and the conductive layer is processed to form the pad electrode, the second member provided with the conductive layer is irradiated with light and the light emission generated in the second member is measured. Here, in the second member provided with the conductive layer, the conductive layer electrically connects the electrical connection point of the N layer and the electrical connection point of the P layer to be in a short-circuited state. In such a short-circuited second member, recombination of carriers is less likely to occur in a portion of the non-defective light emitting element and the light emission luminance is low. On the other hand, in a portion of the light emitting element of the contact failure, since recombination of carriers occurs actively therein even in a state in which the conductive layer electrically connects the electrical connection point of the N layer and the electrical connection point of the P layer (in a short-circuited state), the light emission luminance is higher than that of the non-defective product. In this way, the light emission luminance from the second member in a state in which the conductive layer electrically connects the electrical connection point of the N layer and the electrical connection point of the P layer varies depending on the presence or absence of the contact failure. Therefore, as in the manufacturing method according to an aspect of the present invention, since the second member in which the conductive layer electrically connects the electrical connection point of the N layer and the electrical connection point of the P layer is irradiated with light and the light emission from the second member is measured, it is possible to distinguish a portion of the light emitting element with a contact failure and a portion of the light emitting element without a contact failure based on the measured light emission luminance. Accordingly, it is possible to appropriately detect the contact failure of the light emitting element and improve the accuracy of determination on whether the light emitting element is defective or not. Then, in the manufacturing method of the semiconductor device according to an aspect of the present invention, since it is possible to detect the contact failure in the manufacturing step of the semiconductor device as described above, it is possible to easily and rapidly detect the contact failure compared to, for example, a case in which a separate inspection is performed to detect the contact failure (a separate inspection is performed at a time other than the manufacturing step).

The manufacturing method may further include a fifth step of irradiating the semiconductor device with light and measuring light emission generated in the semiconductor device after the fourth step. In the semiconductor device produced through the fourth step, the first pad electrode and the second pad electrode are formed and the electrical connection point of the N layer and the electrical connection point of the P layer are not electrically connected to each other. The light emission luminance from the semiconductor device varies depending on the presence or absence of the leak failure. Therefore, since the semiconductor device is irradiated with light and the light emission from the semiconductor device is measured after the fourth step, it is possible to distinguish a portion of the light emitting element with a leak failure and a portion of the light emitting element without a leak failure based on the measured light emission luminance. Accordingly, it is possible to appropriately detect the leak failure of the light emitting element.

The manufacturing method may further include a sixth step of determining whether the light emitting element is a non-defective product or a defective product based on the identification result acquired by identifying a portion of the light emitting element with a contact failure based on a measurement result in the third step and identifying a portion of the light emitting element with a leak failure based on a measurement result in the fifth step. According to such a configuration, it is possible to appropriately detect the light emitting element with a contact failure and the light emitting element with a leak failure as a defective product and improve the accuracy of determination on whether the light emitting element is defective or not.

The manufacturing method may further include a seventh step of identifying a position corresponding to each light emitting element of the semiconductor device in the reflected image based on a reflected image obtained by irradiating the second member with light and measuring reflected light from the second member and previously acquired design data of the semiconductor device. Accordingly, it is possible to determine a certain light emitting element that generates light emission on the design data when measuring the light emission.

An inspection method according to an aspect of the present invention includes: a conductive layer forming step of forming a conductive layer on a surface provided with the insulating film so that an electrical connection point of an N layer and an electrical connection point of a P layer in an insulating film on a laminated film are electrically connected to each other in a measurement object during formation of a plurality of light emitting elements; and a first measurement step of irradiating the measurement object with light and measuring light emission generated in the measurement object in a state in which the conductive layer electrically connects the electrical connection point of the N layer and the electrical connection point of the P layer. In the inspection method according to an aspect of the present invention, the measurement object is irradiated with light and the light emission from the measurement object is measured in a state in which the conductive layer electrically connects the electrical connection point of the N layer and the electrical connection point of the P layer. Here, a state in which the electrical connection point of the N layer and the electrical connection point of the P layer are electrically connected to each other is a short-circuited state. In such a short-circuited measurement object, recombination of carriers is less likely to occur in a portion of the non-defective light emitting element and the light emission luminance is low. On the other hand, in a portion of the light emitting element of the contact failure, since recombination of carriers occurs actively even in a state in which the conductive layer electrically connects the electrical connection point of the N layer and the electrical connection point of the P layer (in a short-circuited state), the light emission luminance is higher than that of the non-defective product. In this way, the light emission luminance from the measurement object in a state in which the conductive layer electrically connects the electrical connection point of the N layer and the electrical connection point of the P layer varies depending on the presence or absence of the contact failure. Therefore, as in the inspection method according to an aspect of the present invention, since the measurement object in which the conductive layer electrically connects the electrical connection point of the N layer and the electrical connection point of the P layer is irradiated with light and the light emission from the measurement object is measured, it is possible to distinguish a portion of the light emitting element with a contact failure and a portion of the light emitting element without a contact failure based on the measured light emission luminance. Accordingly, it is possible to appropriately detect the contact failure of the light emitting element and improve the accuracy of determination on whether the light emitting element is defective or not.

The inspection method may further include a second measurement step of irradiating the measurement object with light and measuring light emission generated in the measurement object in a state in which the conductive layer is processed so that the electrical connection point of the N layer and the electrical connection point of the P layer are not electrically connected to each other. The light emission luminance from the semiconductor device in which the electrical connection point of the N layer and the electrical connection point of the P layer are not electrically connected to each other varies depending on the presence or absence of the leak failure. Therefore, since such a semiconductor device is irradiated with light and the light emission from the semiconductor device is measured, it is possible to distinguish a portion of the light emitting element with a leak failure and a portion of the light emitting element without a leak failure based on the measured light emission luminance. Accordingly, it is possible to appropriately detect the leak failure of the light emitting element.

The inspection method may further include a determination step of identifying a portion of the light emitting element with a contact failure based on a measurement result in the first measurement step, identifying a portion of the light emitting element with a leak failure based on a measurement result in the second measurement step, and determining whether the light emitting element is a non-defective product or a defective product based on the identification result. According to such a configuration, it is possible to appropriately detect the light emitting element with a contact failure and the light emitting element with a leak failure as a defective product and improve the accuracy of determination on whether the light emitting element is defective or not.

The inspection method may further include an identification step of identifying a position corresponding to each light emitting element of the measurement object in the reflected image based on a reflected image obtained by irradiating the measurement object with light and measuring reflected light from the measurement object and previously acquired design data of the measurement object. Accordingly, it is possible to determine a certain light emitting element that generates light emission on the design data when measuring the light emission.

An inspection apparatus according to an aspect of the present invention includes: a light irradiation part which irradiates a measurement object with light during formation of a plurality of light emitting elements; an optical measurement part which measures light emission generated in the measurement object in response to the light irradiated by the light irradiation part; and a process unit which outputs a measurement result of the optical measurement part, wherein the process unit outputs the measurement result of the optical measurement part in a state in which a conductive layer is formed on a surface provided with an insulating film on a laminated film in the measurement object so that an electrical connection point of an N layer and an electrical connection point of a P layer in the insulating film are electrically connected to each other. As described above, the light emission luminance from the measurement object in which the electrical connection point of the N layer and the electrical connection point of the P layer are electrically connected to each other (in a short-circuited state) varies depending on the presence or absence of the contact failure. Therefore, as in the inspection apparatus according to an aspect of the present invention, since the measurement result is output from the optical measurement part in a state in which the conductive layer is formed and the electrical connection point of the N layer and the electrical connection point of the P layer are electrically connected to each other, it is possible to distinguish a portion of the light emitting element with a contact failure and a portion of the light emitting element without a contact failure based on the measured light emission luminance. Accordingly, it is possible to appropriately detect the contact failure of the light emitting element and improve the accuracy of determination on whether the light emitting element is defective or not.

The process unit may output the measurement result of the optical measurement part in a state in which the conductive layer is processed so that the electrical connection point of the N layer and the electrical connection point of the P layer are not electrically connected to each other. As described above, the light emission luminance from the measurement object in a state in which the electrical connection point of the N layer and the electrical connection point of the P layer are not electrically connected to each other varies depending on the presence or absence of the leak failure. Therefore, since the measurement result is output from the optical measurement part in a state in which the electrical connection point of the N layer and the electrical connection point of the P layer are not electrically connected to each other, it is possible to distinguish a portion of the light emitting element with a leak failure and a portion of the light emitting element without a leak failure based on the measured light emission luminance. Accordingly, it is possible to appropriately detect the leak failure of the light emitting element.

The process unit may identify a portion of the light emitting element with a contact failure based on the measurement result of the optical measurement part in a state in which the electrical connection point of the N layer and the electrical connection point of the P layer are electrically connected to each other, identify a portion of the light emitting element with a leak failure based on the measurement result of the optical measurement part in a state in which the electrical connection point of the N layer and the electrical connection point of the P layer are not electrically connected to each other, and determine whether the light emitting element is a non-defective product or a defective product based on the identification result. According to such a configuration, it is possible to appropriately detect the light emitting element with a contact failure and the light emitting element with a leak failure as a defective product and improve the accuracy of determination on whether the light emitting element is defective or not.

The optical measurement part may further measure reflected light from the measurement object in response to the light irradiated by the light irradiation part, and the process unit may identify a position corresponding to each light emitting element of the measurement object in a reflected image based on the reflected image obtained by measuring the reflected light in the optical measurement part and previously acquired design data of the measurement object. Accordingly, it is possible to determine a certain light emitting element that generates light emission on the design data when measuring the light emission.

Advantageous Effects of Invention

According to an aspect of the present invention, it is possible to appropriately detect a contact failure of a light emitting element.

BRIEF DESCRIPTION OF DRAWINGS

FIG. 3 is a diagram illustrating a manufacturing step of a semiconductor device.

DESCRIPTION OF EMBODIMENTS

Figure 1:
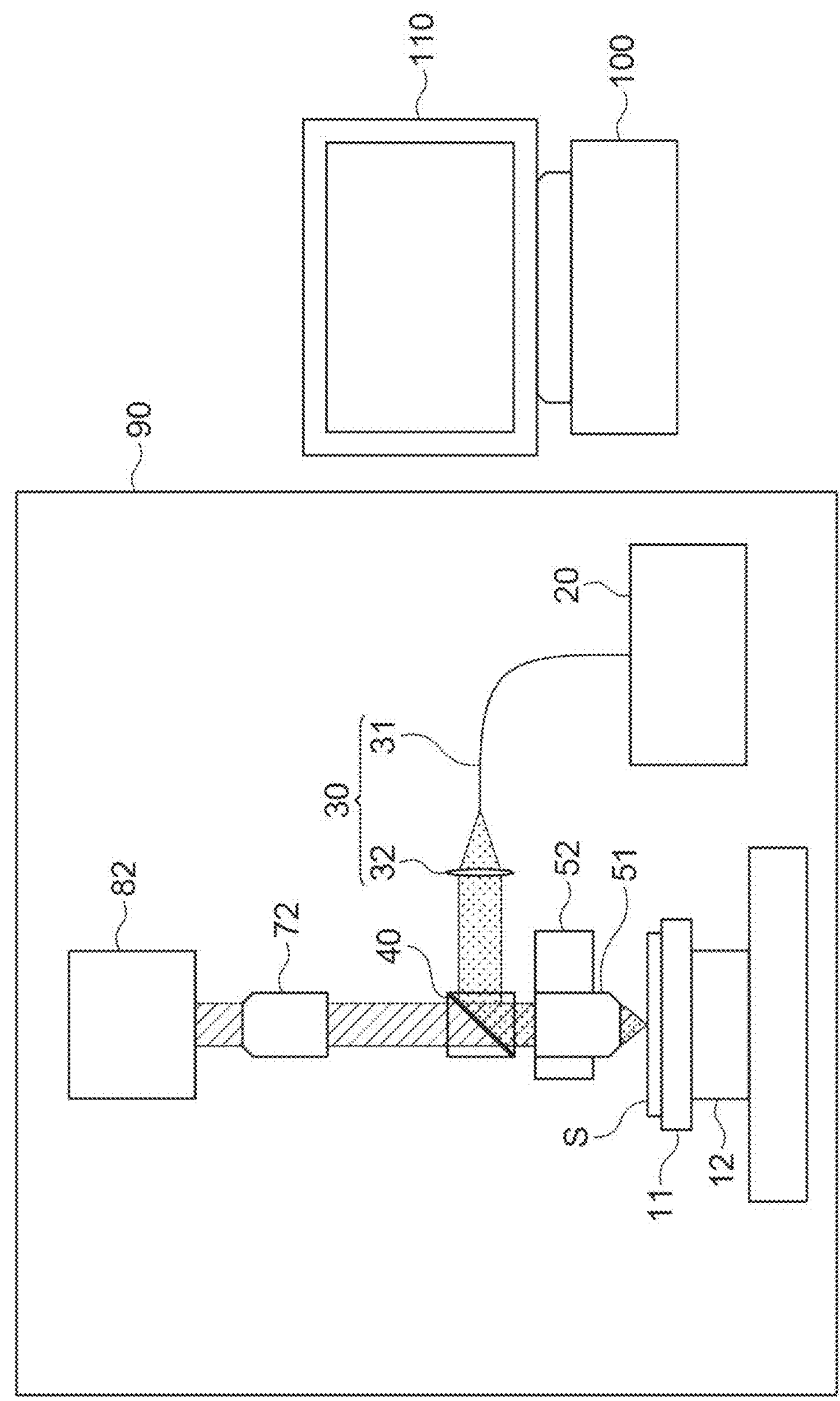
FIG. 1 is a configuration diagram of an inspection apparatus 1 according to an embodiment of the present invention.

Hereinafter, an embodiment of the present invention will be described in detail with reference to the drawings. In each figure, the same or corresponding parts are denoted by the same reference numerals, and redundant descriptions are omitted.

FIG. 1 is a configuration diagram of an inspection apparatus 1 according to this embodiment. The inspection apparatus 1 is an apparatus which inspects a sample S (measurement object). The sample S is a semiconductor device in which a plurality of light emitting elements are formed on a wafer. Additionally, the sample S (measurement object) described in this embodiment includes not only a completed semiconductor device but also an (uncompleted) semiconductor device which is being manufactured. In the semiconductor device which is being manufactured, the light emitting element may be in the process of being formed. As a term indicating such the light emitting element under formation, it is accurate to describe the light emitting element as, for example, a "portion to be the light emitting element" or a "portion of the light emitting element", but hereinafter, the light emitting element under formation may be simply referred to as the "light emitting element". The light emitting element is, for example, an LED, a mini-LED, a μLED, an SLD element, a laser element, a vertical laser element (VCSEL), or the like. The inspection apparatus 1 determines whether a product is a defective product corresponding to a contact failure or a leak failure or whether the product is a non-defective product by observing photoluminescence (specifically, fluorescence) for each of the plurality of light emitting elements formed on the sample S. Additionally, it is also conceivable to inspect such a light emitting element, for example, by probing (that is, based on electrical characteristics). However, for fine LEDs such as μLEDs, it is physically difficult to probe with a needle for measurement. In this regard, since the method of inspecting the light emitting element based on photoluminescence according to this embodiment can perform inspection by acquiring a fluorescence image, a large number of light emitting elements can be efficiently inspected without being bound by physical restrictions.

As shown in FIG. 1, the inspection apparatus 1 includes a chuck 11, an XY stage 12, an excitation light source 20 (light irradiation part), an optical system 30, a dichroic mirror 40, an objective lens 51, a Z stage 52, an imaging lens 72, a camera 82 (optical measurement part), a dark box 90, a control apparatus 100 (process unit), and a monitor 110. The dark box 90 accommodates, for example, a component other than the control apparatus 100 and the monitor 110 in the above-described components and is provided to avoid the influence of external light on each accommodated component. Additionally, each component accommodated in the dark box 90 may be mounted on an anti-vibration table in order to improve the quality of the image captured by the camera 82 (improvement of image quality and prevention of positional deviation of the image).

The chuck 11 is a holding member that holds the sample S. For example, the chuck 11 holds the sample S by vacuum-sucking the wafer of the sample S. The XY stage 12 is a stage that moves the chuck 11 holding the sample S in the XY direction (the front and rear direction and the left and right direction), that is, the direction along the placement surface of the sample S in the chuck 11. The XY stage 12 moves the chuck 11 in the XY direction so that each of the plurality of light emitting elements is sequentially irradiated with the excitation light in the irradiation region in response to the control of the control apparatus 100. Additionally, the inspection apparatus 1 may further include a rotation stage (Θ stage (not shown)). Such a rotation stage may be provided, for example, above the XY stage 12 and below the chuck 11 or may be provided integrally with the XY stage 12. The rotation stage is for accurately aligning the vertical and horizontal positions of the sample S. Since the rotation stage is provided, it is possible to shorten the time for alignment and the like and shorten the total time for data processing.

The excitation light source 20 is a light irradiation part which generates excitation light to irradiate the sample S and irradiates the sample S with the excitation light. The excitation light source 20 may be a light source capable of generating light having a wavelength that excites the light emitting element of the sample S, such as an LED, a laser, a halogen lamp, a mercury lamp, a D2 lamp, and a plasma light source. In addition, the inspection apparatus 1 may further include a sensor for monitoring the illumination luminance in order to keep the luminance of the excitation light emitted from the excitation light source 20 constant. Further, in order to reduce shading as much as possible, a diffusion plate, a fly-eye lens, or the like may be used at the position where the excitation light is emitted from the excitation light source 20 to homogenize the luminance distribution.

The optical system 30 includes an optical fiber cable 31 and a light guide lens 32. The optical fiber cable 31 is a light guiding optical fiber cable connected to the excitation light source 20. As the optical fiber cable 31, for example, a polarization maintaining fiber, a single mode fiber, or the like can be used. The light guide lens 32 is, for example, a single or compound convex lens, and guides the excitation light reaching via the optical fiber cable 31 toward the dichroic mirror 40. In order to prevent the wavelength of the excitation light emitted from the excitation light source 20 from changing with time, the inspection apparatus 1 may include a bandpass filter (not shown) between the excitation light source 20 and the dichroic mirror 40.

The dichroic mirror 40 is a mirror made of a special optical material that reflects light of a specific wavelength and transmits light of other wavelengths. Specifically, the dichroic mirror 40 is configured to reflect the excitation light in the direction of the objective lens 51 and to transmit photoluminescence (more specifically, fluorescence) from the light emitting element, which is light in a wavelength band different from that of the excitation light, in the direction of the imaging lens 72. In addition, the region of the normal emission spectrum of excitation light may be on the lower wavelength side than the region of the normal emission spectrum of fluorescence (normal fluorescence spectrum). That is, the dichroic mirror 40 reflects the excitation light which is light in a low wavelength band toward the objective lens 51 and transmits fluorescence which is light in a higher wavelength band than the excitation light toward the imaging lens 72.

The objective lens 51 is configured to observe the sample S and collects the excitation light guided by the dichroic mirror 40 onto the sample S. The Z stage 52 moves the objective lens 51 in the Z direction (up and down direction), that is, in a direction intersecting the placement surface of the sample S in the chuck 11 to perform focus adjustment.

The imaging lens 72 is a lens which forms an image of the fluorescence of the light emitting element having passed through the dichroic mirror 40 and guides the fluorescence to the camera 82. The camera 82 captures the fluorescence of the light emitting element. That is, the camera 82 measures by capturing the luminescence (fluorescence) generated in the sample S in response to the excitation light emitted by the excitation light source 20. The camera 82 detects the image formed by the imaging lens 72. The camera 82 outputs a PL image (fluorescence image), which is the imaging result, to the control apparatus 100. The camera 82 is, for example, an area image sensor such as CCD or MOS. Further, the camera 82 may be configured by a line sensor or a TDI sensor. Additionally, the camera 82 also captures (measures) reflected light from the sample S in response to the excitation light irradiating the sample S by the excitation light source 20 as will be described later.

The control apparatus 100 controls the XY stage 12, the excitation light source 20, the Z stage 52, and the camera 82. Specifically, the control apparatus 100 adjusts the irradiation region of the excitation light (the irradiation region in the sample S) by controlling the XY stage 12. The control apparatus 100 performs focus adjustment related to the excitation light by controlling the Z stage 52. The control apparatus 100 adjusts the emission of the excitation light and adjusts the wavelength and amplitude of the excitation light by controlling the excitation light source 20. The control apparatus 100 controls the camera 82 to perform adjustment related to the acquisition of fluorescence image. Further, the control apparatus 100 determines the quality of the light emitting element based on the fluorescence image captured by the camera 82 (details will be described later). Additionally, the control apparatus 100 is a computer, and physically includes a memory such as a RAM and a ROM, a processor (arithmetic circuit) such as a CPU, a communication interface, and a storage unit such as a hard disk. Examples of the control apparatus 100 include personal computers, cloud servers, and smart devices (smartphones, tablet terminals, and the like). The control apparatus 100 functions by executing a program stored in a memory by the CPU of the computer system. The monitor 110 is a display apparatus that displays a PL image (fluorescence image) or the like, which is a measurement result.

Next, a manufacturing step of the semiconductor device which is the sample S of the inspection apparatus 1 will be described with reference to FIGS. 3 and 4. The manufacturing step of the semiconductor device is performed in a manufacturing apparatus 500 (see FIG. 5). In the manufacturing step, a sapphire substrate 401 is first prepared as shown in FIG. 3(*a*). The sapphire substrate 401 may be produced through, for example, a single crystal growth process for producing an ingot, a processing process for thinly slicing a sapphire of ingot, a CMP (Chemical Mechanical Polishing) process for flatly polishing the ingot, and the like. Additionally, a substrate made of another material suitable for the semiconductor may be used instead of the sapphire substrate 401.

Next, an epitaxial growth process is performed on the sapphire substrate 401 and a laminated film including a buffer layer 402 (see FIG. 3(*b*)), an n-GaN layer 403 (see FIG. 3(*c*)) which is an electron transport layer, a light emitting layer 404 (see FIG. 3(*d*)), and a p-GaN layer 405 (see FIG. 3(*e*)) which a hole transport layer is formed on the sapphire substrate 401. The epitaxial growth process may be performed by, for example, LPE (Liquid Phase Epitaxy) or MOVPE (Metal Organic Vapor Phase Epitaxy). Additionally, the electron transport layer and the hole transport layer are not necessarily made of GaN, and may be a semiconductor containing another element that does not cause mismatch in band energy and lattice spacing with the light emitting layer 404. Further, the positions of the n-GaN layer 403 and the p-GaN layer 405 may be opposite to each other.

Next, element isolation is performed as shown in FIG. 3(*f*). Specifically, resist application, patterning, etching, and resist removal are sequentially performed. Next, a process of exposing the n-GaN layer 403 is performed as shown in FIG. 4(*a*). Specifically, resist application, patterning, etching, and resist removal are sequentially performed. The order of the element isolation process shown in FIG. 3(*f*) and the process shown in FIG. 4(*a*) may be reversed.

Figure 4:
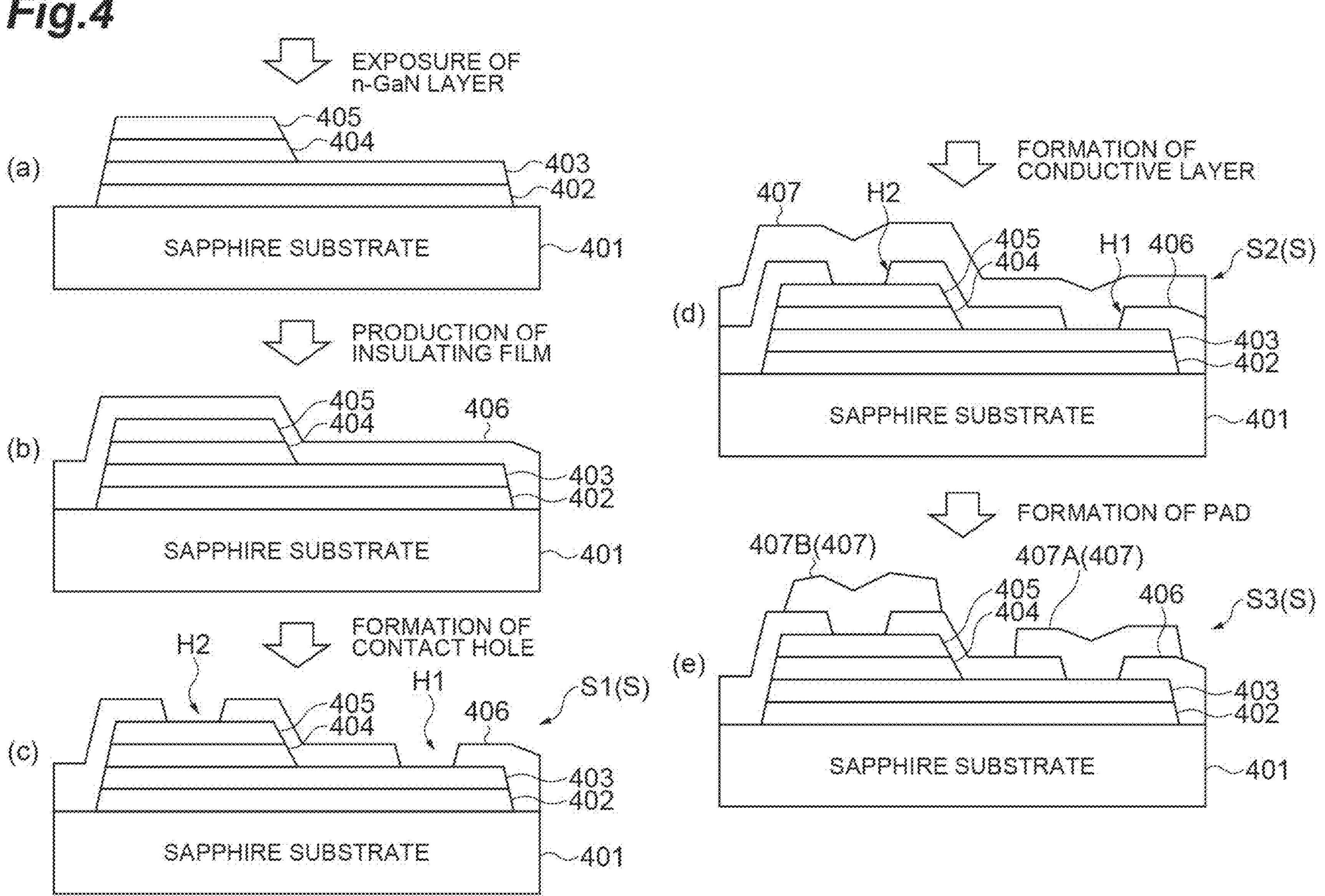
FIG. 4 is a diagram illustrating a manufacturing step of a semiconductor device.

Next, an insulating film 406 is formed on the laminated film as shown in FIG. 4(*b*). Then, contact holes H1 and H2 penetrating the insulating film 406 are formed at predetermined positions of the insulating film 406 as shown in FIG. 4(*c*). The contact hole H1 is formed at the electrical connection point of the n-GaN layer 403 in the insulating film 406. The contact hole H2 is formed at the electrical connection point of the p-GaN layer 405 in the insulating film 406. The member produced by the steps up to this point is a first member S1.

Next, a conductive layer 407 is formed as shown in FIG. 4(*d*) on the surface of the first member S1 on which the insulating film 406 is formed. The conductive layer 407 is an electrode material such as metal or ITO (Indium Tin Oxide). The conductive layer 407 is formed over substantially the entire surface on which the insulating film 406 is formed. Therefore, the conductive layer 407 electrically connects (conducts) the electrical connection point of the n-GaN layer 403 and the electrical connection point of the p-GaN layer 405. The member produced by the steps up to this point is a second member S2.

Next, a first pad electrode 407A corresponding to the electrical connection point of the n-GaN layer 403 and a second pad electrode 407B corresponding to the electrical connection point of the p-GaN layer 405 are formed by processing the conductive layer 407 formed on the second member S2. Specifically, resist application, patterning, etching, and resist removal are sequentially performed to form the first pad electrode 407A and the second pad electrode 407B. In a semiconductor device S3 in which the first pad electrode 407A and the second pad electrode 407B are formed, the electrical connection point of the n-GaN layer 403 and the electrical connection point of the p-GaN layer 405 are not electrically connected to each other. The above is the manufacturing step of the semiconductor device.

Figure 5:
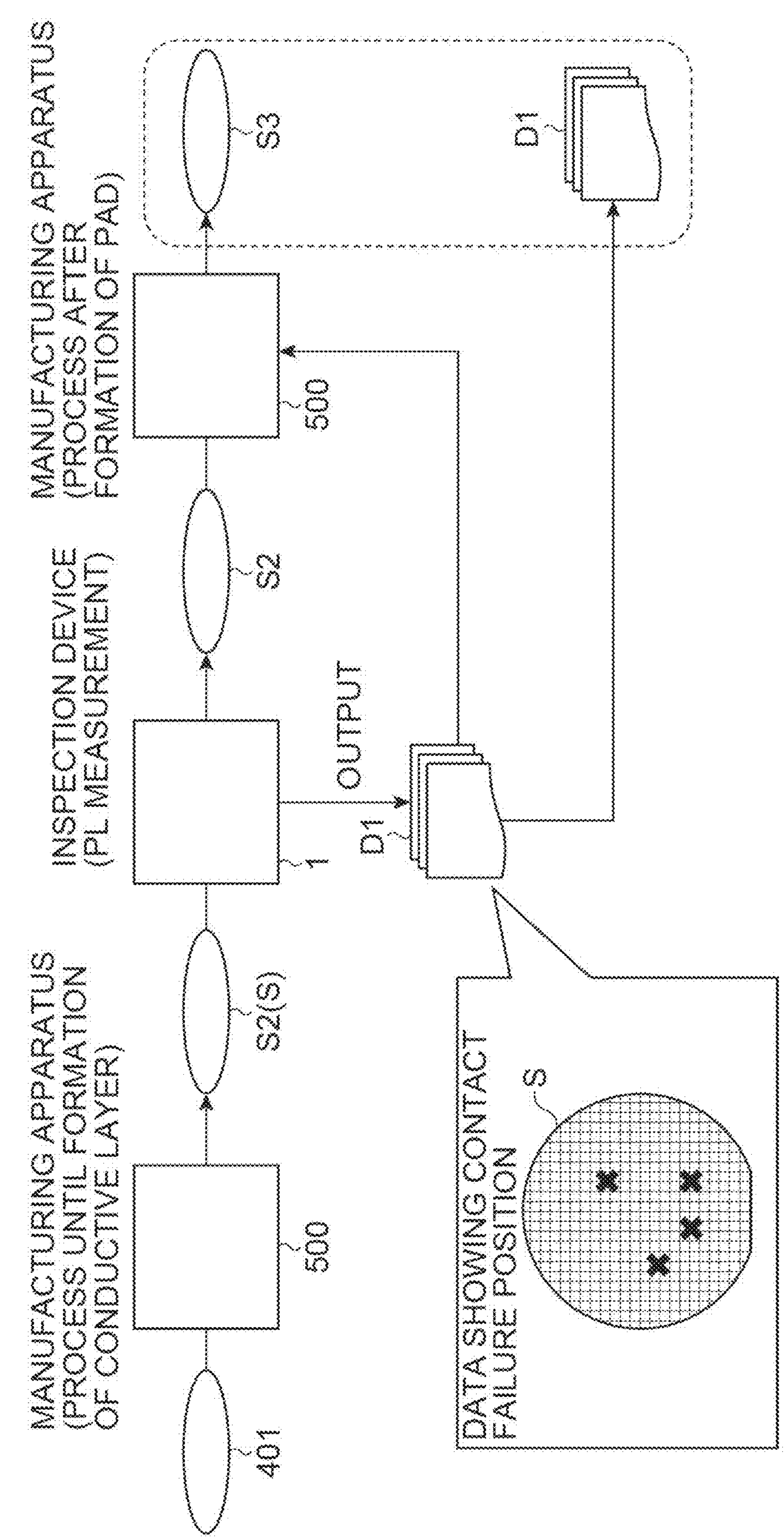
FIG. 5 is a diagram illustrating manufacturing and inspection steps of a semiconductor device.

Here, in this embodiment, the inspection step of the semiconductor device is performed during the manufacturing step of the semiconductor device. Hereinafter, the inspection step during the manufacturing step of the semiconductor device will be described later. FIG. 5 is a diagram illustrating an example of the manufacturing and inspection steps of the semiconductor device.

In the example shown in FIG. 5, an epitaxial growth process (see FIGS. 3(*b*) to 3(*e*)), element isolation (see FIG. 3(*f*)), a process of exposing the n-GaN layer 403 (see FIG. 4(*a*)), a process of forming the insulating film 406 (see FIG. 4(*b*)), a process of forming the contact holes H1 and H2 (see FIG. 4(*c*)), and a conductive layer forming process of forming the conductive layer 407 (see FIG. 4(*d*)) are first performed on the sapphire substrate 401 to produce the second member S2 in the manufacturing apparatus 500. Then, in the inspection apparatus 1, a first measurement step (details will be described later) which is PL measurement for the second member S2 is performed while the second member S2 is the sample S. Although the details will be described later, in the determination step after the first measurement step, the contact failure position of the second member S2 is identified and data D1 indicating the contact failure position is output. Then, in the manufacturing apparatus 500, processes subsequent to a pad forming process (see FIG. 4(*e*)) of forming the first pad electrode 407A and the second pad electrode 407B are performed on the second member S2 to produce the semiconductor device S3. Since the data D1 indicating the contact failure position is acquired, it is possible to remove the light emitting element with a contact failure in the semiconductor device S3 based on the data D1. In this way, in this embodiment, the first measurement step which is PL measurement for identifying the contact failure position is performed after the conductive layer forming process and before the pad forming process in the manufacturing step.

The first measurement step is a step related to the detection of the light emitting element with a contact failure and a step of measuring light emission generated in the second member S2 by irradiating the second member S2 which is a measurement object with light in a state in which the conductive layer 407 electrically connects the electrical connection point of the n-GaN layer 403 and the electrical connection point of the p-GaN layer 405 (that is, before the pad forming process) after the conductive layer forming process (conductive layer forming step). In the first measurement step, a surface (rear surface) not provided with the conductive layer 407 in the second member S2 is irradiated with the excitation light emitted from the excitation light source 20 in a state in which the second member S2 is disposed on the chuck 11. Additionally, when the conductive layer 407 is formed of a transparent material such as ITO, the excitation light may be irradiated from a surface (front surface) on the side of the conductive layer 407. Then, the light emission generated in the second member S2 in response to the excitation light is transmitted through the dichroic mirror 40, is formed into an image by the imaging lens 72, and is detected (measured) as a PL image in the camera 82. Then, the control apparatus 100 outputs a detection (measurement) result of the camera 82 in a state in which the conductive layer 407 is formed so that the electrical connection point of the n-GaN layer 403 is electrically connected to the electrical connection point of the p-GaN layer 405 for the determination step to be described later.

The determination step is performed by the control apparatus 100. In the determination step, the control apparatus 100 identifies the light emitting element with a contact failure based on the measurement result in the first measurement step.

The identification of the contact failure will be described. A state in which the conductive layer 407 electrically connects the electrical connection point of the n-GaN layer 403 and the electrical connection point of the p-GaN layer 405 corresponding to a state in which the first measurement step is performed is a state in which each light emitting element in the second member S2 is in a short-circuited state. In such a state, recombination of carriers is less likely to occur in a non-defective light emitting element, and the light emission luminance is relatively low. On the other hand, since recombination of carriers actively occurs in the light emitting element even in a short-circuited state of the light emitting element with a contact failure, the light emission luminance is higher than that of a non-defective light emitting element. In this way, the light emission luminance related to each light emitting element measured in the first measurement step varies depending on the presence or absence of the contact failure. The control apparatus 100 identifies the luminance of each light emitting element in the PL image and identifies the light emitting element with a contact failure based on the luminance. In the PL image of FIG. 2(*c*), only the luminance of a certain light emitting element 200*z* is higher than the luminance of the other light emitting elements. In such a case, the control apparatus 100 identifies the light emitting element 200*z* as the light emitting element with a contact failure. The control apparatus 100 generates and outputs data D1, which is a contact failure map defining addresses (positions) of light emitting elements with contact failures.

Then, the control apparatus 100 identifies the light emitting element with a contact failure in the semiconductor device S3 as a defective product based on the data D1 which is the measurement result in the first measurement step and outputs the address of the defective light emitting element. Accordingly, it is possible to improve the quality of panels and the like using light emitting elements without using the defective light emitting element in subsequent processes.

Figure 6:
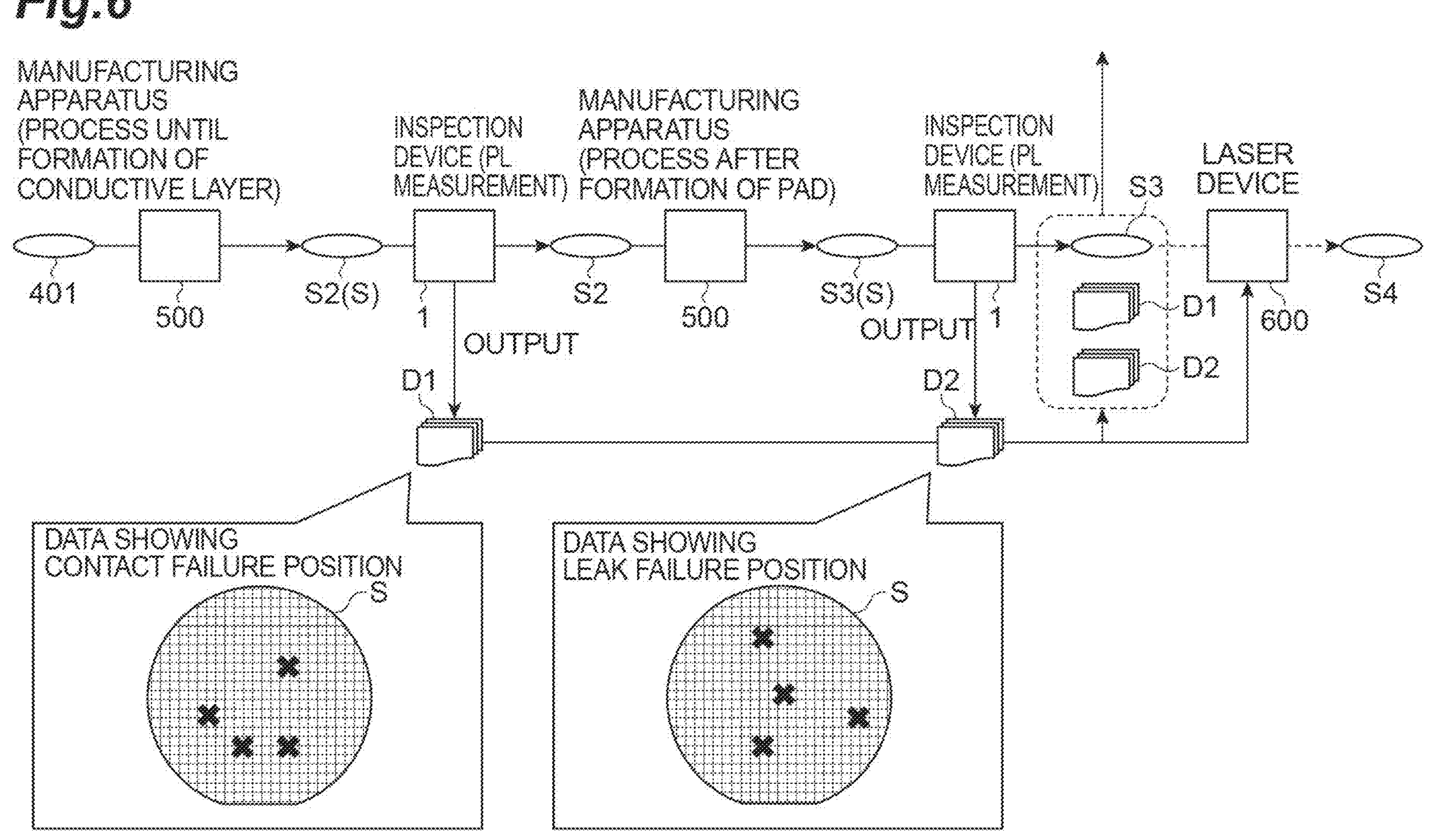
FIG. 6 is a diagram illustrating manufacturing and inspection steps of a semiconductor device.

FIG. 6 is a diagram illustrating another example of the manufacturing and inspection steps of the semiconductor device. In the example shown in FIG. 6, a second measurement step is performed while the semiconductor device S3 subjected to the pad forming process is the sample S in addition to the step of FIG. 5. Further, a determination step corresponding to the second measurement step is performed.

The second measurement step is a step related to the detection of the light emitting element with a leak failure and is a step in which the pad forming process is performed, the semiconductor device S3 not electrically connecting the electrical connection point of the n-GaN layer 403 and the electrical connection point of the p-GaN layer 405 is irradiated with light, and light emission generated in the semiconductor device S3 is measured. In the second measurement step, the semiconductor device S3 is irradiated with the excitation light emitted from the excitation light source 20 while the semiconductor device S3 is disposed on the chuck 11. Then, the light emission generated in the semiconductor device S3 in response to the excitation light is transmitted through the dichroic mirror 40, is formed into an image by the imaging lens 72, and is detected (measured) as a PL image in the camera 82. Then, the control apparatus 100 outputs a detection (measurement) result of the camera 82 in a state in which the electrical connection point of the n-GaN layer 403 and the electrical connection point of the p-GaN layer 405 are not electrically connected to each other for the determination step to be described later.

In the determination step, the control apparatus 100 identifies the light emitting element with a contact failure based on the measurement result in the first measurement step, identifies the light emitting element with a leak failure based on the measurement result in the second measurement step, and determines whether the light emitting element is a non-defective product or a defective product based on the identification result. The identification of the contact failure is as described above.

The identification of the leak failure will be described. In the light emission from the light emitting element in a state in which the electrical connection point of the n-GaN layer 403 and the electrical connection point of the p-GaN layer 405 are not electrically connected to each other corresponding to a state in which the second measurement step is performed, the luminance of the light emitting element with a leak failure (short-circuit failure) is extremely low compared to a non-defective light emitting element. The control apparatus 100 identifies the luminance of each light emitting element in the PL image and identifies the light emitting element with a leak failure based on the luminance. In the PL image of FIG. 2(*b*), only the luminance of a certain light emitting element 200*x* is extremely lower than the luminance of the other light emitting elements. In such a case, the control apparatus 100 identifies the light emitting element 200*x* as the light emitting element with a leak failure. The control apparatus 100 generates and outputs data D2, which is a leak failure map that defines the addresses (positions) of light emitting elements with leak failures.

Then, the control apparatus 100 identifies the light emitting element with a contact failure based on the data D1 which is the measurement result in the first measurement step, identifies the light emitting element with a leak failure based on the data D2 which is the measurement result in the second measurement step, and determines whether the light emitting element is a non-defective product or a defective product based on the identification result. The control apparatus 100 identifies the light emitting elements without contact failures and leak failures by deriving the exclusive OR of the data D1 and the data D2, determines the light emitting elements as non-defective products, determines the other light emitting elements as defective products, and outputs the address of the defective light emitting element. Accordingly, it is possible to improve the quality of panels and the like using light emitting elements without using the defective light emitting element in subsequent processes. Further, since the address of the defective light emitting element is output, it is possible to remove the defective light emitting element by laser using a laser apparatus 600 (see FIG. 6). In this case, a semiconductor device S4 (see FIG. 6) can be produced from which the defective light emitting element is removed.

Figure 2:
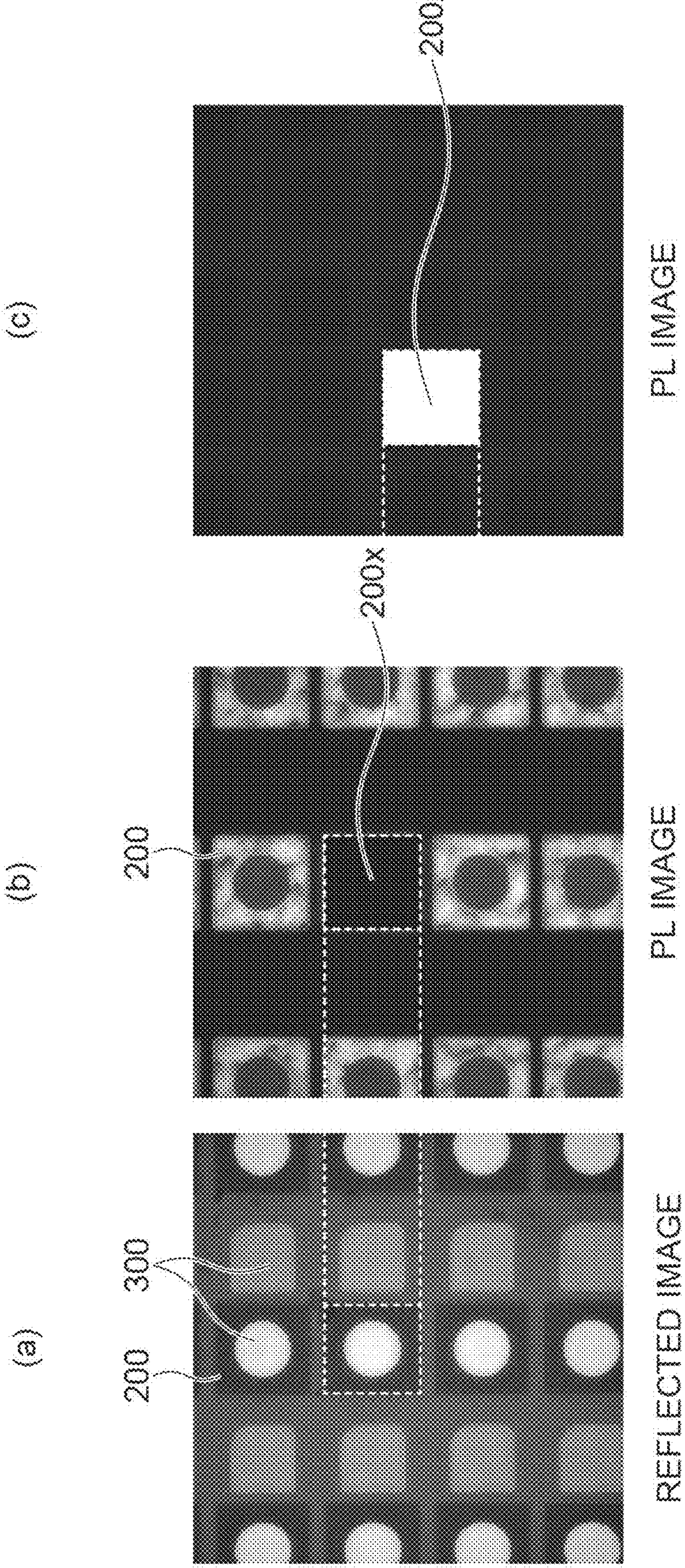
FIG. 2 is a diagram showing an imaging result of a camera, where FIG. 2(*a*) is a reflected image, FIG. 2(*b*) is a PL image showing leak failure, and FIG. 2(*c*) is a PL image showing contact failure.

Additionally, an identification step of aligning the light emitting elements may be performed before the first measurement step and the second measurement step. In the identification step, the position corresponding to each light emitting element of the sample S in the reflected image is identified based on the reflected image obtained by measuring the reflected light from the sample S after irradiating the sample S with light and the previously acquired design data of the sample S (the light emitting elements are aligned). In the identification step before the first measurement step, the light emitted from the excitation light source 20 irradiates the second member S2, the reflected light is detected in the camera 82, and the reflected image (for example, the image shown in FIG. 2(*a*)) is acquired. In the identification step before the second measurement step, the light emitted from the excitation light source 20 irradiates the semiconductor device S3, the reflected light is detected in the camera 82, and the reflected image (for example, the image shown in FIG. 2(*a*)) is acquired. As shown in FIG. 2(*a*), the reflected image shows an image corresponding to each light emitting element 200 and each electrode 300. Then, for example, the control apparatus 100 identifies the position corresponding to each light emitting element of the sample S in the reflected image by comparing the reflected image with the design data of the sample S. The design data here indicates at least the state (position, shape, and the like) of each light emitting element and electrode of the sample S. In this way, since each light emitting element of the sample S identifies a certain position of the acquired image before the first measurement step and the second measurement step, it is possible to identify a certain light emitting element corresponding to each position of the PL image acquired in the first measurement step and the second measurement step.

Figure 7:
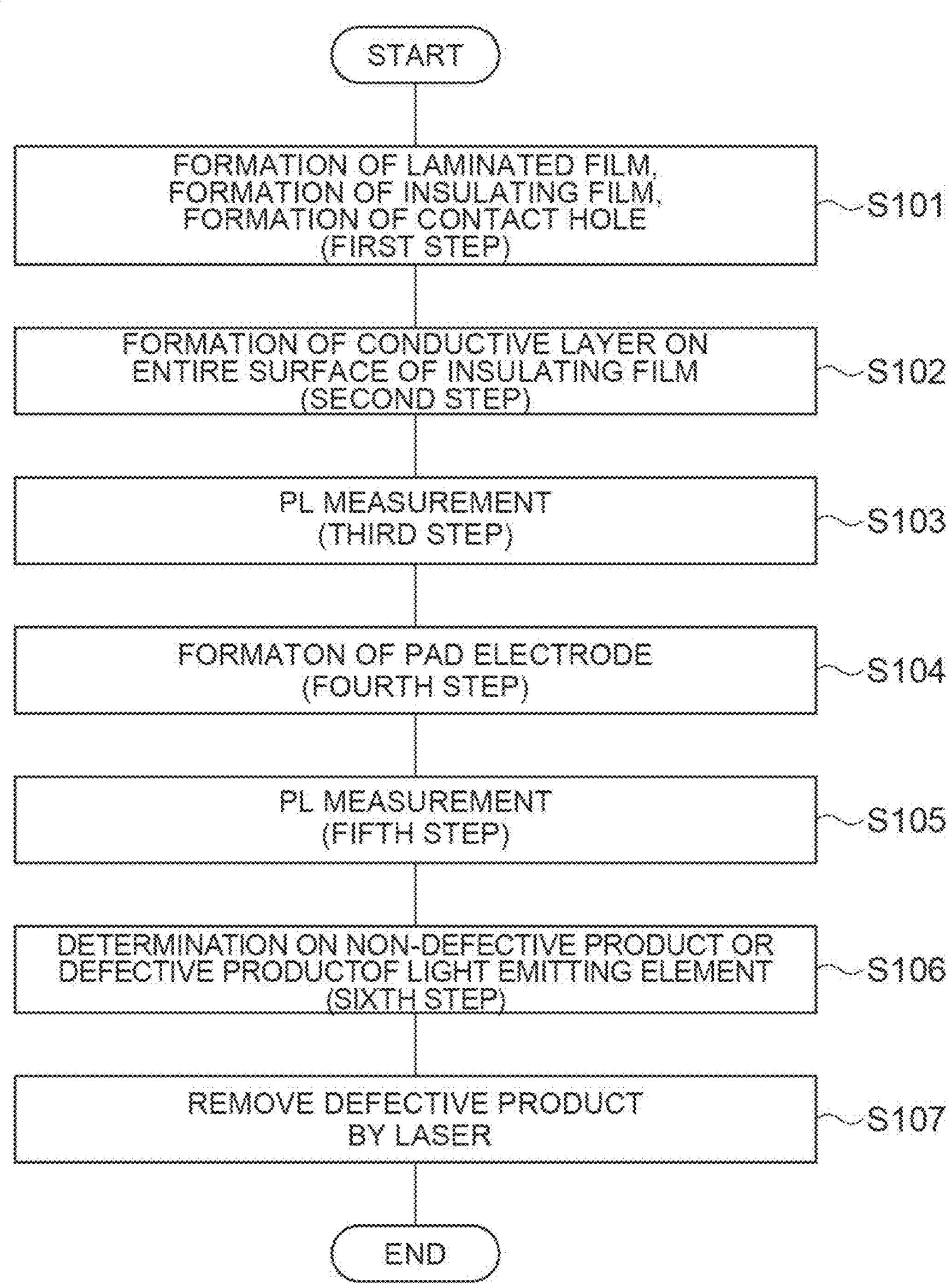
FIG. 7 is a flowchart showing a sequence of a manufacturing method of a semiconductor device.

Next, a sequence of the manufacturing method of the semiconductor device S4 will be described with reference to FIG. 7. In this manufacturing method, the inspection step of the semiconductor device is performed during the manufacturing step. FIG. 7 is a flowchart showing a sequence of the manufacturing method of the semiconductor device S4.

As shown in FIG. 7, an epitaxial growth process is first performed to grow crystals on the sapphire substrate 401 so that a laminated film including the buffer layer 402, the n-GaN layer 403, the light emitting layer 404, and the p-GaN layer 405 is formed thereon and the insulating film 406 is formed on the laminated film. Further, the contact hole H1 is formed at the electrical connection point of the n-GaN layer 403 of the insulating film 406 and the contact hole H2 is formed at the electrical connection point of the p-GaN layer 405 of the insulating film 406 (first step, step S101). The first member S1 is produced by the first step.

Next, the conductive layer 407 is formed on the entire surface of the surface provided with the insulating film 406 in the first member S1 (second step, step S102). In the second step, the second member S2 in which the conductive layer 407 electrically connects the electrical connection point of the n-GaN layer 403 and the electrical connection point of the p-GaN layer 405 is produced.

Next, PL measurement is performed by irradiating the second member S2 with the excitation light and measuring the light emission generated in the second member S2 (third step, step S103). In this case, the control apparatus 100 identifies the luminance of each light emitting element in the PL image and identifies the light emitting element of the contact failure based on the luminance. The control apparatus 100 generates and outputs data D1, which is a contact failure map defining addresses (positions) of light emitting elements with contact failures.

Next, the first pad electrode 407A corresponding to the electrical connection point of the n-GaN layer 403 and the second pad electrode 407B corresponding to the electrical connection point of the p-GaN layer 405 are formed by processing the conductive layer 407 formed on the second member S2 (fourth step, step S104). In this way, in the semiconductor device S3 provided with the first pad electrode 407A and the second pad electrode 407B, the electrical connection point of the n-GaN layer 403 and the electrical connection point of the p-GaN layer 405 are not electrically connected to each other.

Next, PL measurement is performed by irradiating the semiconductor device S3 with the excitation light and measuring the light emission generated in the semiconductor device S3 (fifth step, step S105). In this case, the control apparatus 100 identifies the luminance of each light emitting element in the PL image and identifies the light emitting element with a leak failure based on the luminance. The control apparatus 100 generates and outputs data D2, which is a leak failure map that defines the addresses (positions) of light emitting elements with leak failures.

Next, the control apparatus identifies the light emitting element with a contact failure based on the data D1, identifies the light emitting element with a leak failure based on the data D2, and determines whether the light emitting element is a non-defective product or a defective product based on the identification result (sixth step, step S106).

Finally, the defective light emitting element is removed by laser using the laser apparatus 600 (step S107) and the semiconductor device S4 from which the defective light emitting element is removed is produced.

Next, the operation and effect of the manufacturing method, the inspection method, and the inspection apparatus 1 of the semiconductor device S3 according to this embodiment will be described.

The manufacturing method of the semiconductor device S3 according to this embodiment is a manufacturing method of a semiconductor device provided with a plurality of light emitting elements including: a first step of forming a laminated film including the buffer layer 402, the n-GaN layer 403, the light emitting layer 404, and the p-GaN layer 405 by growing crystals on the sapphire substrate 401, forming the insulating film 406 on the laminated film, and forming the contact holes H1 and H2 at the electrical connection point of the n-GaN layer 403 and the electrical connection point of the p-GaN layer 405 in the insulating film 406 to produce the first member S1; a second step of forming the conductive layer 407 on the surface provided with the insulating film 406 in the first member S1 to produce the second member S2 in which the conductive layer 407 electrically connects the electrical connection point of the n-GaN layer 403 and the electrical connection point of the p-GaN layer 405; a third step of irradiating the second member S2 with excitation light and measuring light emission generated in the second member S2; and a fourth step of forming the first pad electrode 407A corresponding to the electrical connection point of the n-GaN layer 403 and the second pad electrode 407B corresponding to the electrical connection point of the p-GaN layer 405 by processing the conductive layer 407 formed on the second member S2 to produce the semiconductor device S3.

In the manufacturing method of the semiconductor device S3 according to this embodiment, in the manufacturing step of the semiconductor device S3 in which the laminated film and the insulating film 406 are formed, the contact holes H1 and H2 are formed at the electrical connection point of the n-GaN layer 403 and the electrical connection point of the p-GaN layer 405 in the insulating film 406, the conductive layer 407 is formed on the insulating film 406, and the conductive layer 407 is processed to form the first pad electrode 407A and the second pad electrode 407B, the second member S2 provided with the conductive layer 407 is irradiated with excitation light and light emission generated in the second member S2 is measured. Here, in the second member S2 provided with the conductive layer 407, the conductive layer 407 electrically connects the electrical connection point of the n-GaN layer 403 and the electrical connection point of the p-GaN layer 405 to be in a short-circuited state. In such a short-circuited second member S2, recombination of carriers is less likely to occur in a non-defective light emitting element and light emission luminance is low. On the other hand, since recombination of carriers occurs actively even in a state in which the conductive layer 407 electrically connects the electrical connection point of the n-GaN layer 403 and the electrical connection point of the p-GaN layer 405 (in a short-circuited state) in the light emitting element with a contact failure, the light emission luminance is higher than that of the non-defective product. In this way, the light emission luminance from the second member S2 in a state in which the conductive layer 407 electrically connects the electrical connection point of the n-GaN layer 403 and the electrical connection point of the p-GaN layer 405 varies depending on the presence or absence of the contact failure. Therefore, as in the manufacturing method according to this embodiment, since the second member S2 in which the conductive layer 407 electrically connects the electrical connection point of the n-GaN layer 403 and the electrical connection point of the p-GaN layer 405 is irradiated with the excitation light and the light emission from the second member S2 is measured, it is possible to distinguish the light emitting element with a contact failure and the light emitting element without a contact failure based on the measured light emission luminance. Accordingly, it is possible to appropriately detect the contact failure of the light emitting element and improve the accuracy of determination on whether the light emitting element is defective or not. Then, in the manufacturing method of the semiconductor device S3 according to this embodiment, since it is possible to detect the contact failure in the manufacturing step of the semiconductor device S3 as described above, it is possible to easily and rapidly detect the contact failure compared to, for example, a case in which a separate inspection is performed to detect the contact failure (a separate inspection is performed at a time other than the manufacturing step).

The manufacturing method may further include a fifth step of irradiating the semiconductor device S3 with the excitation light and measuring the light emission generated in the semiconductor device S3 after the fourth step. In the semiconductor device S3 produced through the fourth step, the first pad electrode 407A and the second pad electrode 407B are formed and the electrical connection point of the n-GaN layer 403 and the electrical connection point of the p-GaN layer 405 are not electrically connected to each other. The light emission luminance from the semiconductor device S3 varies depending on the presence or absence of the leak failure. Therefore, since the semiconductor device S3 is irradiated with the excitation light and the light emission from the semiconductor device S3 is measured after the fourth step, it is possible to distinguish the light emitting element with a leak failure and the light emitting element without a leak failure based on the measured light emission luminance. Accordingly, it is possible to appropriately detect the leak failure of the light emitting element.

The manufacturing method may further include a sixth step of identifying the light emitting element with a contact failure based on the measurement result in the third step, identifying the light emitting element with a leak failure based on the measurement result in the fifth step, and determining whether the light emitting element is a non-defective product or a defective product based on the identification result. According to such a configuration, it is possible to appropriately detect the light emitting element with a contact failure and the light emitting element with a leak failure as a defective product and improve the accuracy of determination on whether the light emitting element is defective or not.

The manufacturing method may further include a seventh step of identifying a position corresponding to each light emitting element of the semiconductor device in the reflected image based on the reflected image obtained by irradiating the second member S2 with light and measuring the reflected light from the second member S2 and the previously acquired design data of the semiconductor device. Accordingly, it is possible to determine a certain light emitting element that generates light emission on the design data when measuring the light emission.

The inspection method according to this embodiment includes a conductive layer forming step of forming the conductive layer 407 on the surface provided with the insulating film 406 so that the electrical connection point of the n-GaN layer 403 and the electrical connection point of the p-GaN layer 405 in the insulating film 406 on the laminated film are electrically connected to each other in the measurement object during the formation of a plurality of light emitting elements and a first measurement step of irradiating the measurement object with the excitation light and measuring the light emission generated in the measurement object in a state in which the conductive layer 407 electrically connects the electrical connection point of the n-GaN layer 403 and the electrical connection point of the p-GaN layer 405. According to the inspection method of this embodiment, as in the manufacturing method, it is possible to appropriately detect the contact failure of the light emitting element and improve the accuracy of determination on whether the light emitting element is defective or not.

The inspection apparatus 1 according to this embodiment includes the excitation light source 20 (light irradiation part) which irradiates a measurement object with light during the formation of a plurality of light emitting elements, the camera 82 (optical measurement part) which measures the light emission generated in the measurement object in response to the light irradiated by the excitation light source 20, and the control apparatus 100 (process unit) which outputs a measurement result of the camera 82 and the control apparatus 100 outputs a measurement result of the camera 82 in a state in which the conductive layer 407 is formed on the surface provided with the insulating film 406 on the laminated film in the measurement object so that the electrical connection point of the n-GaN layer 403 and the electrical connection point of the p-GaN layer 405 of the insulating film 406 are electrically connected to each other. According to the inspection apparatus 1 of this embodiment, as in the manufacturing method, it is possible to appropriately detect the contact failure of the light emitting element and improve the accuracy of determination on whether the light emitting element is defective or not.

REFERENCE SIGNS LIST

1: Inspection apparatus
20: Excitation light source (light irradiation part)
82: Camera (optical measurement part)
100: Control apparatus (process unit)

The invention claimed is:

1. A manufacturing method of a semiconductor device provided with a plurality of light emitting elements, comprising:

forming a laminated film including a buffer layer, an n-type semiconductor layer, a light emitting layer, and a p-type semiconductor layer by growing crystals on a substrate, forming an insulating film on the laminated film, and forming contact holes at an electrical connection point of the n-type semiconductor layer and an electrical connection point of the p-type semiconductor layer in the insulating film to produce a first member;

forming a conductive layer on a surface provided with the insulating film in the first member to produce a second member in which the conductive layer electrically connects the electrical connection point of the n-type semiconductor layer and the electrical connection point of the p-type semiconductor layer;

irradiating the second member with light and measuring light emission generated in the second member, and distinguishing a contact failure portion from a non-contact failure portion based on luminance of the measured light emission; and forming a first pad electrode corresponding to the electrical connection point of the n-type semiconductor layer and a second pad electrode corresponding to the electrical connection point of the p-type semiconductor layer by processing the conductive layer formed on the second member to produce the semiconductor device.

2. The manufacturing method of the semiconductor device according to claim 1, further comprising:

irradiating the semiconductor device with light and measuring light emission generated in the semiconductor device after forming the first pad electrode.

3. The manufacturing method of the semiconductor device according to claim 2, further comprising:

determining whether a light emitting element is a non-defective product or a defective product based on an identification result acquired by identifying a portion of the light emitting element with a contact failure based on a measurement result in irradiating the second member and identifying a portion of the light emitting element with a leak failure based on a measurement result in irradiating the semiconductor device.

4. The manufacturing method of the semiconductor device according to claim 1, further comprising:

identifying a position corresponding to each light emitting element of a plurality of light emitting elements of the semiconductor device in a reflected image based on the reflected image obtained by irradiating the second member with light and measuring reflected light from the second member and previously acquired design data of the semiconductor device.

5. An inspection method comprising:

forming step of forming a conductive layer on a surface provided with the insulating film so that an electrical connection point of an n-type semiconductor layer and an electrical connection point of a p-type semiconductor layer in an insulating film on a laminated film are electrically connected to each other in a measurement object during formation of a plurality of light emitting elements; and irradiating the measurement object with light and measuring light emission generated in the measurement object in a state in which the conductive layer electrically connects the electrical connection point of the n-type semiconductor layer and the electrical connection point of the p-type semiconductor layer, and distinguishing a contact failure portion from a non-contact failure portion based on luminance of the measured light emission.

6. The inspection method according to claim 5, further comprising:

irradiating the measurement object with light and measuring light emission generated in the measurement object in a state in which the conductive layer is processed so that the electrical connection point of the n-type semiconductor layer and the electrical connection point of the p-type semiconductor layer are not electrically connected to each other.

7. The inspection method according to claim 6, further comprising:

identifying a portion of an light emitting element with a contact failure based on a measurement result in irradiating the measurement object with light and measuring light emission generated in the measurement object in the state in which the conductive layer electrically connects the electrical connection point of the n-type semiconductor layer and the electrical connection point of the p-type semiconductor layer, identifying a portion of the light emitting element with a leak failure based on a measurement result in irradiating the measurement object with light and measuring light emission generated in the measurement object in the state in which the conductive layer is processed so that the electrical connection point of the n-type semiconductor layer and the electrical connection point of the p-type semiconductor layer are not electrically connected to each other, and determining whether the light emitting element is a non-defective product or a defective product based on an identification result.

8. The inspection method according to claim 5, further comprising:

identifying a position corresponding to each light emitting element of a plurality of light emitting elements of the measurement object in a reflected image based on the reflected image obtained by irradiating the measurement object with light and measuring reflected light from the measurement object and previously acquired design data of the measurement object.

9. An inspection apparatus comprising:

a light irradiation part configured to irradiate a measurement object with light during formation of a plurality of light emitting elements;

an optical measurement part configured to measure light emission generated in the measurement object in response to the irradiated light of the light irradiation part; and a processor configured to output a measurement result of the optical measurement part, wherein the processor outputs the measurement result of the optical measurement part in a state in which a conductive layer is formed on a surface provided with an insulating film on a laminated film in the measurement object so that an electrical connection point of an n-type semiconductor layer and an electrical connection point of a p-type semiconductor layer in the insulating film are electrically connected to each other, and distinguishes a contact failure portion from a non-contact failure portion based on luminance of the measured light emission.

10. The inspection apparatus according to claim 9, wherein the processor outputs the measurement result of the optical measurement part in a state in which the conductive layer is processed so that the electrical connection point of the n-type semiconductor layer and the electrical connection point of the p-type semiconductor layer are not electrically connected to each other.

11. The inspection apparatus according to claim 10, wherein the processor identifies a portion of a light emitting element of the plurality of light emitting elements with a contact failure based on the measurement result of the optical measurement part in a state in which the electrical connection point of the n-type semiconductor layer and the electrical connection point of the p-type semiconductor layer are electrically connected to each other, identifies a portion of the light emitting element with a leak failure based on the measurement result of the optical measurement part in a state in which the electrical connection point of the n-type semiconductor layer and the electrical connection point of the p-type semiconductor layer are not electrically connected to each other, and determines whether the light emitting element is a non-defective product or a defective product based on an identification result.

12. The inspection apparatus according to claim 9, wherein the optical measurement part further measures reflected light from the measurement object in response to the irradiated light of the light irradiation part, and wherein the processor identifies a position corresponding to each light emitting element of the plurality of light emitting elements of the measurement object in a reflected image based on the reflected image obtained by measuring the reflected light in the optical measurement part and previously acquired design data of the measurement object.

* * * * *